(12) United States Patent
Ali

(10) Patent No.: US 10,749,436 B2
(45) Date of Patent: Aug. 18, 2020

(54) ZERO CROSS COMPARATOR

(71) Applicant: Dialog Semiconductor (UK) Limited, London (GB)

(72) Inventor: Shafqat Ali, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/865,712

(22) Filed: Jan. 9, 2018

(65) Prior Publication Data

US 2019/0214914 A1    Jul. 11, 2019

(51) Int. Cl.
| | |
|---|---|
| H02M 3/158 | (2006.01) |
| H02M 3/335 | (2006.01) |
| H03K 17/12 | (2006.01) |
| G01R 19/175 | (2006.01) |
| H02M 1/00 | (2006.01) |

(52) U.S. Cl.
CPC ....... H02M 3/1588 (2013.01); H02M 3/1582 (2013.01); H02M 3/33523 (2013.01); H03K 17/122 (2013.01); G01R 19/175 (2013.01); H02M 2001/0009 (2013.01); H02M 2001/0038 (2013.01); H02M 2001/0058 (2013.01)

(58) Field of Classification Search
CPC .... H02M 3/156; H02M 3/158; H02M 3/1584; H02M 3/1588; H02M 3/1582; H02M 3/33523; H02M 2001/0009; H02M 2001/0038; H02M 2001/0058; Y02B 70/1466; H03K 17/122; G01R 19/175
USPC ................... 323/271, 282–285, 288
See application file for complete search history.

(56) References Cited

U.S. PATENT DOCUMENTS

| | | | |
|---|---|---|---|
| 2006/0043943 A1* | 3/2006 | Huang | H02M 3/158 323/222 |
| 2007/0080674 A1* | 4/2007 | Gray | H02M 3/1588 323/282 |
| 2007/0236971 A1 | 10/2007 | Chen | |

(Continued)

OTHER PUBLICATIONS

German Office Action, File No. 10 2016 219 591.3, Applicant: Dialog Semiconductor (UK) Limited, dated Jun. 8, 2017, 5 pgs, and English language translation, 6 pgs.

(Continued)

*Primary Examiner* — Shawki S Ismail
*Assistant Examiner* — Monica Mata
(74) *Attorney, Agent, or Firm* — Saile Ackerman LLC; Stephen B. Ackerman

(57) ABSTRACT

A switched-mode power converter and a method for operation is presented. The switched-mode power converter has a high side switching element, a low side switching element, and an inductor. Both the high side switching element and the low side switching element are coupled to an input terminal of the inductor. A zero cross comparator generates a trigger signal for opening the low side switching element. A sampling unit samples, at a time when the low side switching element is switching, an inductor voltage at the input terminal of the inductor. An integrating unit determines an offset voltage by integrating the sampled inductor voltage. Finally, an input voltage of the zero cross comparator is adjusted by subtracting the determined offset voltage from the inductor voltage. As a result, the switching behavior of the switched-mode power converter is optimized.

16 Claims, 13 Drawing Sheets

(56) References Cited

U.S. PATENT DOCUMENTS

| | | | | |
|---|---|---|---|---|
| 2008/0067993 A1* | 3/2008 | Coleman | ................ | H02M 1/15 |
| | | | | 323/282 |
| 2014/0340065 A1 | 11/2014 | Svorc et al. | | |
| 2015/0137776 A1 | 5/2015 | Thomas et al. | | |
| 2015/0318785 A1 | 11/2015 | Svore | | |
| 2015/0364998 A1 | 12/2015 | North | | |
| 2016/0049859 A1* | 2/2016 | de Cremoux | ........... | H02M 1/08 |
| | | | | 323/282 |
| 2017/0063228 A1* | 3/2017 | Kimura | ................ | H02M 3/158 |

OTHER PUBLICATIONS

German Office Action, File Ref: 10 2016 219 591.3, Applicant: Dialog Semiconductor (UK) Limited, dated Feb. 18, 2019, 6 pages, and English language translation, 6 pages.

* cited by examiner

ZERO CROSS COMPARATOR

TECHNICAL FIELD

The present document relates to power supplies and more particularly to zero cross comparators for discontinuous current mode operated switching mode power supplies.

BACKGROUND

Zero cross comparators play an important role in determining the efficiency of a switching converter in discontinuous mode of operation. Typically, zero cross comparators are used in multiphase/single phase buck converters. Their main purpose is to detect when the current in the coil reaches zero. Said current corresponds to the current in the low side switch in a buck converter, for example. The switch has to be closed right at the instant when the zero crossing happens. If the switch is closed before the current through the switch drops to zero, then the current flows through a body diode. If the switch is closed after the current has crossed zero magnitude, the current finds its way through the body diode of the other switch (e.g. the high side switch in a buck architecture). The body diode based conduction impacts the efficiency negatively because of a higher voltage drop across the diode, compared to the voltage drop across the switch.

SUMMARY

The present document addresses the above mentioned technical problems. In particular, the present document addresses the technical problem of providing an adaptive zero cross comparator which optimizes the switching behavior of a switching mode power converter. According to an aspect, a switched-mode power converter is proposed. The power converter comprises a high side switching element, a low side switching element, and an inductor. Both the high side switching element and the low side switching element are coupled to an input terminal of the inductor. A zero cross comparator is configured to generate a trigger signal for opening the low side switching element. A sampling unit is configured to sample, at a time when the low side switching element is switching, an inductor voltage at the input terminal of the inductor. An integrating unit is configured to determine an offset voltage by integrating the sampled inductor voltage. An offset adjusting unit is configured to determine a first input voltage of the zero cross comparator based on the determined offset voltage.

Sampling the inductor voltage at the time instant when the low side switching element is opening (or shortly before the low side switching element is opening) provides a precise correction value indicating both (a) whether the low side switching element was opened too early or too late and (b) how much too early or how much too late the low side switching element was opened. At this, the precision of said correction value may be improved by sampling the inductor voltage as shortly as possible before the low side switching element is opening. In comparison to solutions known from the state of the art, the offset voltage is determined quickly and is directly used to correct an input voltage of the zero cross comparator, resulting in quickly converging adaptive calibration of the zero cross comparator. The described technique is robust against supply voltage noise which may occur at the input supply voltage which is applied at the high side switching element. Moreover, the described technique does not depend on the technology used to achieve its best results.

The high side switching element and the low side switching element may be implemented with any suitable device, such as, for example, a metal-oxide-semiconductor field effect transistor (MOSFET), an IGBT, a MOS-gated thyristor, or other suitable power device. Each switching element has a gate to which a respective driving voltage or control signal may be applied to turn the switching element on (i.e. to close the switching element) or off (i.e. to open the switching element).

The low side switching element may be arranged between the input terminal of the inductor and a reference voltage, e.g. ground. The offset adjusting unit may be configured to determine the first input voltage of the zero cross comparator by subtracting the determined offset voltage from the inductor voltage. For this purpose, the offset adjusting unit may comprise a subtracting unit whose inputs are connectable with the input terminal of the inductor and an output terminal of the integrating unit, and whose output is connected with an input of the zero cross comparator. The other input of the zero cross comparator may be connected with the reference voltage.

Throughout this document, the term "ground" is meant in its broadest possible sense. In particular, ground is not limited to a reference point with a direct physical connection to earth. Rather, the term "ground" may refer to any reference voltage or reference point to which and from which electrical currents may flow or from which voltages may be measured.

The sampling unit may comprise a sampling capacitor configured to temporarily store an inductor charge corresponding to the inductor voltage. In addition, the sampling unit may comprise a ground switching unit configured to establish, based on a control signal for triggering the high side switching element, an electrical connection between an input terminal of the sampling capacitor and the reference voltage, or to isolate said input terminal from the reference voltage. Further, in order to transfer electrical charge from the input terminal of the inductor to the sampling capacitor, the sampling unit may comprise an input switching unit configured to establish, based on an input control signal, an electrical connection between the input terminal of the sampling capacitor and the input terminal of the inductor, or to isolate the latter input terminals from each other. Similarly, the sampling unit may comprise an output switching unit configured to establish, based on an output control signal, an electrical connection between an output terminal of the sampling capacitor and the reference voltage, or to isolate said output terminal from the reference voltage. Both the input control signal and the output control signal may be based on a control signal for triggering the low side switching element. On the one hand, the input control signal may correspond or be identical to the control signal for triggering the low side switching element, and the output control signal may be a time advanced version of the control signal for triggering the low side switching element. On the other hand, as an alternative solution, the output control signal may correspond or be identical to the control signal for triggering the low side switching element, and the input control signal may be a time delayed version of the control signal for triggering the low side switching element.

The integrating unit may comprise an operational amplifier and an integrating capacitor, wherein said integrating capacitor is coupled in between an inverting input terminal of the operational amplifier and an output of the integrating unit. The integrating capacitor may be configured to store a charge indicative of the offset voltage, wherein said charge is successively transferred from the sampling capacitor to the integrating capacitor. A non-inverting input terminal of the operational amplifier may be connected with the reference voltage.

Additionally, the integrating unit may comprise an input switching unit configured to establish, based on a control signal for triggering the high side switching element, an electrical connection between the inverting input terminal of the operational amplifier and an output terminal of the sampling capacitor, or to isolate said inverting input terminal from said output terminal. That is, the input switching unit establishes an electrical connection between the sampling capacitor and the integrating capacitor, and thus, enables successive transfer of charges between both capacitors.

According to another aspect of the present disclosure, an adaptive zero crossing comparison circuit is presented. The circuit is suitable for optimizing the switching behavior of a switched-mode power converter e.g. in discontinuous conduction mode. Specifically, the circuit comprises a zero cross comparator, a sampling unit, an integrating unit and an offset adjusting unit. The zero cross comparator is configured to generate a trigger signal for opening a low side switching element of the switched-mode power converter. The sampling unit is configured to sample, at a time when the low side switching element of the switched-mode power converter is switching (e.g. switching off), an inductor voltage at an input terminal of an inductor of the switched-mode power converter. The integrating unit is configured to determine an offset voltage by integrating the sampled inductor voltage and the offset adjusting unit is configured to determine an input voltage of the zero cross comparator based on the determined offset voltage. In particular, the offset adjusting unit may be configured to determine the input voltage of the zero cross comparator by subtracting the determined offset voltage from the inductor voltage.

According to yet another aspect, a method for operating a switched-mode power converter is presented. Similar as in the foregoing description, the switched-mode power converter is assumed to comprise a high side switching element, a low side switching element, and an inductor. At this, both the high side switching element and the low side switching element are coupled to an input terminal of the inductor. The method comprises generating, by a zero cross comparator, a trigger signal for opening the low side switching element. At a time when the low side switching element is switching (e.g. switching off), an inductor voltage at the input terminal of the inductor is sampled. Based on the sampled inductor voltage, an offset voltage is determined by integrating the sampled inductor voltage. Finally, an input voltage of the zero cross comparator is adjusted based on the determined offset voltage. For example, adjusting said input voltage may comprise the step of determining the input voltage of the zero cross comparator by subtracting the determined offset voltage from the inductor voltage.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
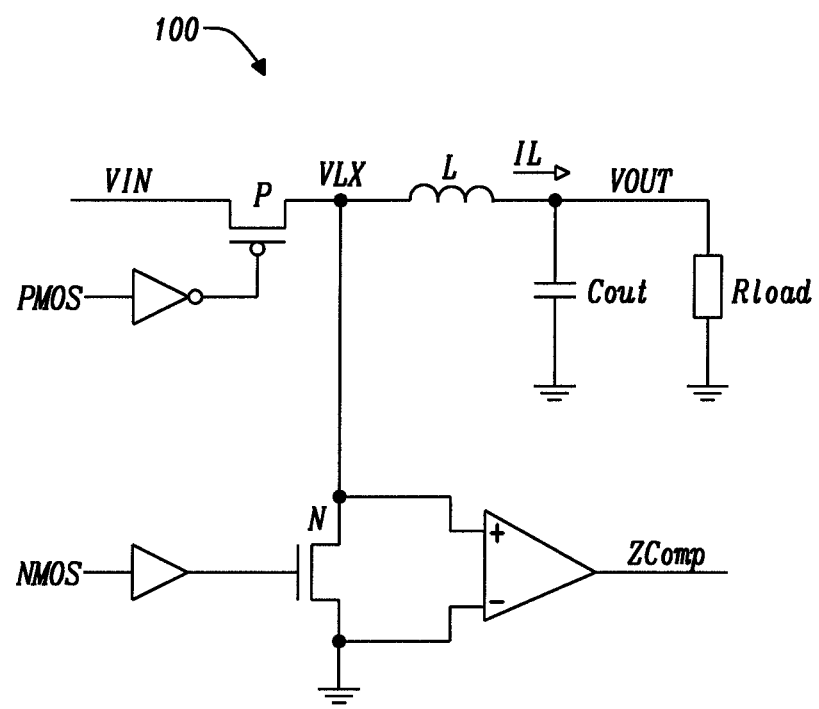
FIG. 1 shows a block diagram of an example buck converter.

FIG. 1 shows a simplified schematic of a typical buck type switched-mode power supply SMPS 100. The PMOS transistor and the NMOS transistor direct the current to and from the inductor L. In parallel to the NMOS transistor, a conventional zero cross comparator is arranged to detect the moment in time when the current through the NMOS transistor is equal to 0, and hence, the voltage across the NMOS transistor is equal to 0, too. In FIG. 1, the voltage at an input terminal of inductor L is denoted as Vlx. The output terminal of the inductor L is connected with output capacitor Cout and with load Rload.

Figure 2:
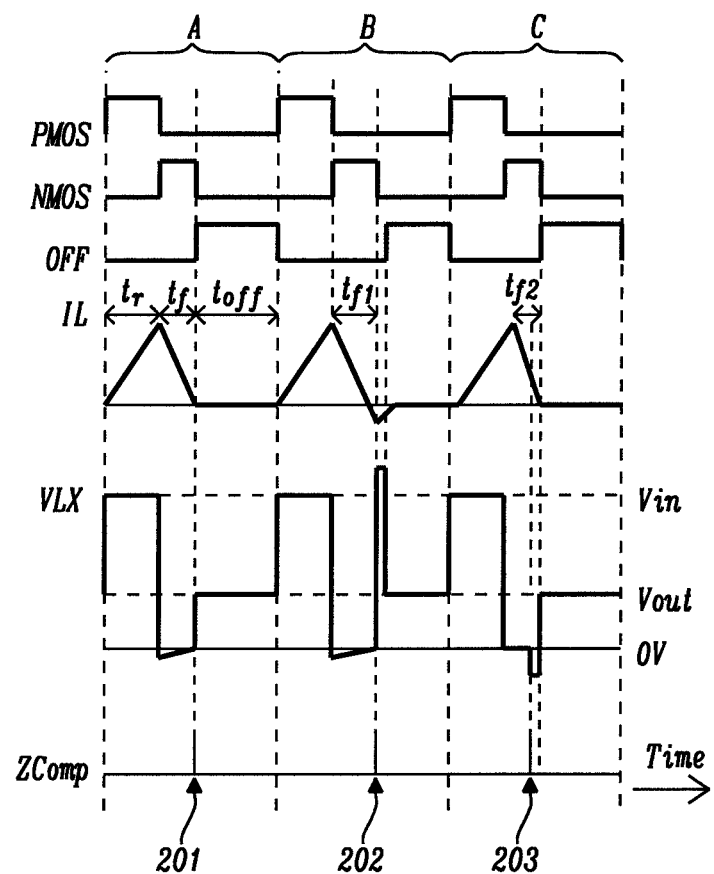
FIG. 2 shows control signals, currents and voltages within an example buck converter.

Various control signals, voltages and currents of the buck type SMPS 100 are depicted in FIG. 2. In particular, FIG. 2 illustrates inductor voltage Vlx at the input terminal of the inductor L. The output signal ZComp of the zero cross comparator forces the NMOS transistor to turn off inductor current IL at times 201, 202, and 203. At time 201 within the illustrated time interval A, NMOS transistor is turned off (exactly) when current IL crosses 0. At time 202 within the illustrated time interval B, NMOS transistor is turned off too late. In the final time interval C, at time 203, NMOS transistor is turned off too early. Given the variations in the devices that make up the components in FIG. 1 and the very small signal input into the zero cross comparator, the resulting variations in inductor current IL and the subsequent output voltage Vout across the load Rload will appear much like that in FIG. 2 for a typical production of the circuit. Improvement in the circuit design is needed if a more consistent circuit response is required.

Figure 3:
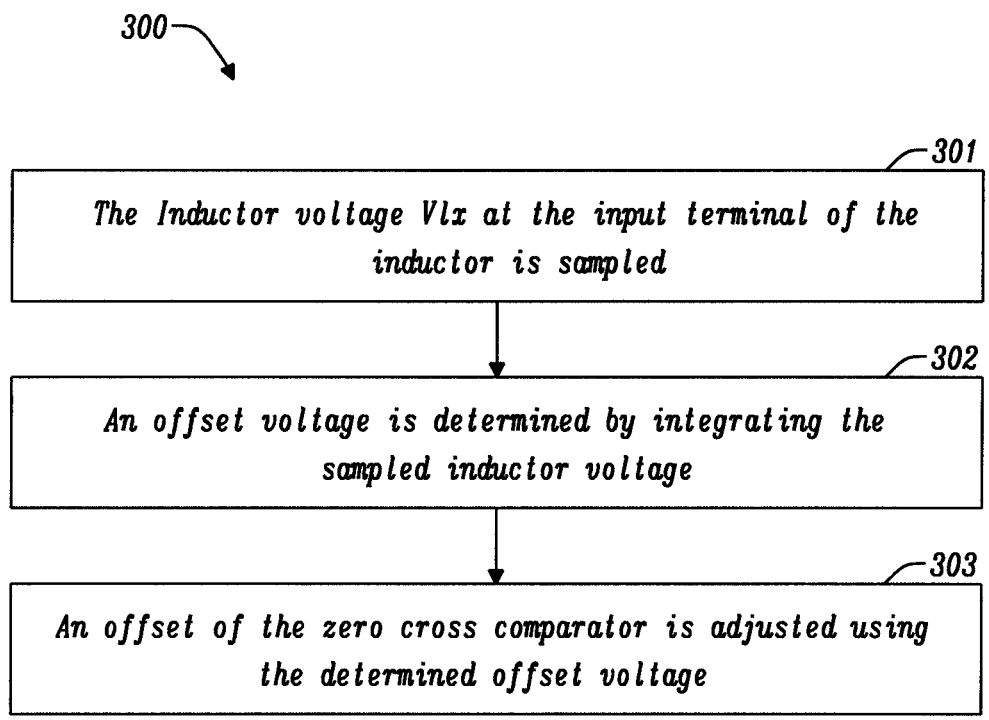
FIG. 3 shows a flow diagram of an exemplary method for controlling a buck converter.

FIG. 3 shows a flow diagram of an exemplary method for controlling a buck converter. In step 301, the inductor voltage Vlx at the input terminal of the inductor is sampled just at or shortly before (i.e. as shortly before as possible) the moment when the low side switching element is turned off. In step 302, an offset voltage is determined by integrating the sampled inductor voltage. In a last step 303, an offset of the zero cross comparator is adjusted using the determined offset voltage. In particular, an offset adjusting unit may adjust an input voltage of the zero cross comparator based on the determined offset voltage.

Figure 4:
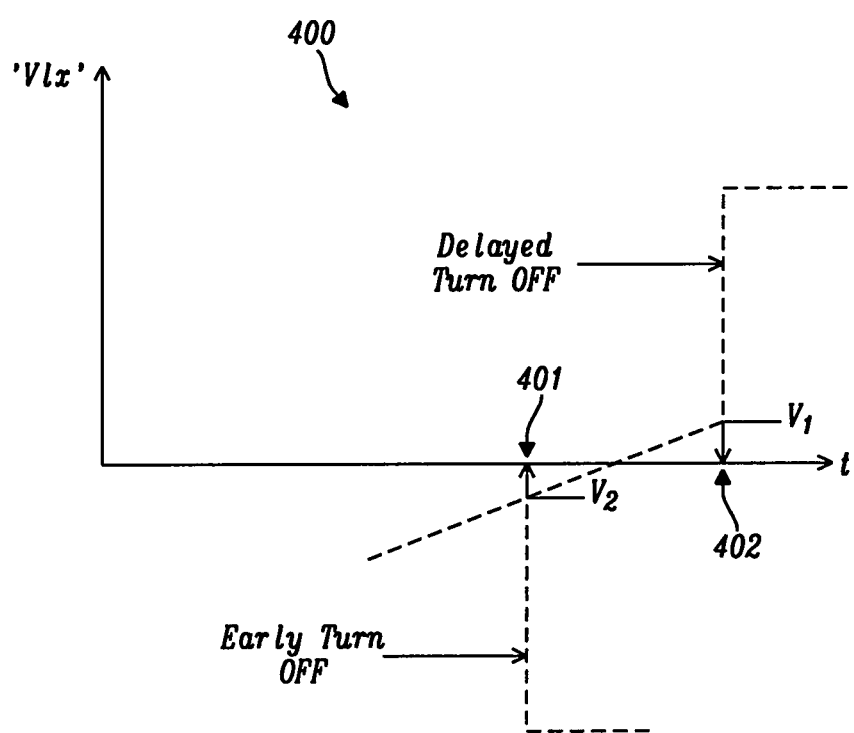
FIG. 4 shows an exemplary diagram illustrating inductor voltage Vlx over time.

FIG. 4 shows an exemplary diagram 400 illustrating inductor voltage Vlx at the input terminal of the inductor of buck converter 100 over time t. FIG. 4 shows two possible scenarios. In the first scenario, the low side switching element (NMOS transistor) turns off too early at time 401. The dashed line illustrates how inductor voltage Vlx drops from a negative voltage V2 at the moment of switching (time 401) to a more negative voltage level. In the second scenario, the low side switching element turns off too late at time 402. The dashed line illustrates how inductor voltage Vlx suddenly rises from a positive voltage V1 at the moment of switching (time 402) to a more positive voltage level. In both scenarios, the inductor voltages V1 and V2 at the moments of switching are sampled. As will be described in the following paragraphs, the sampled inductor voltages V1 and V2 may be used for adjusting the offset of the zero cross comparator to optimize the switching of the low side switching element. To be more specific, sampling the inductor voltage at or close to the switching moment of the low side switching element provides the advantage that an estimate for an offset voltage is obtained which comprises e.g. the effects of delays and may be directly used to tune the zero cross comparator. Moreover, the described technique is robust against supply voltage noise which may occur at the input supply voltage which is applied at the high side switching element. Moreover, the described technique does not depend on the technology used to achieve its best results.

Figure 5:
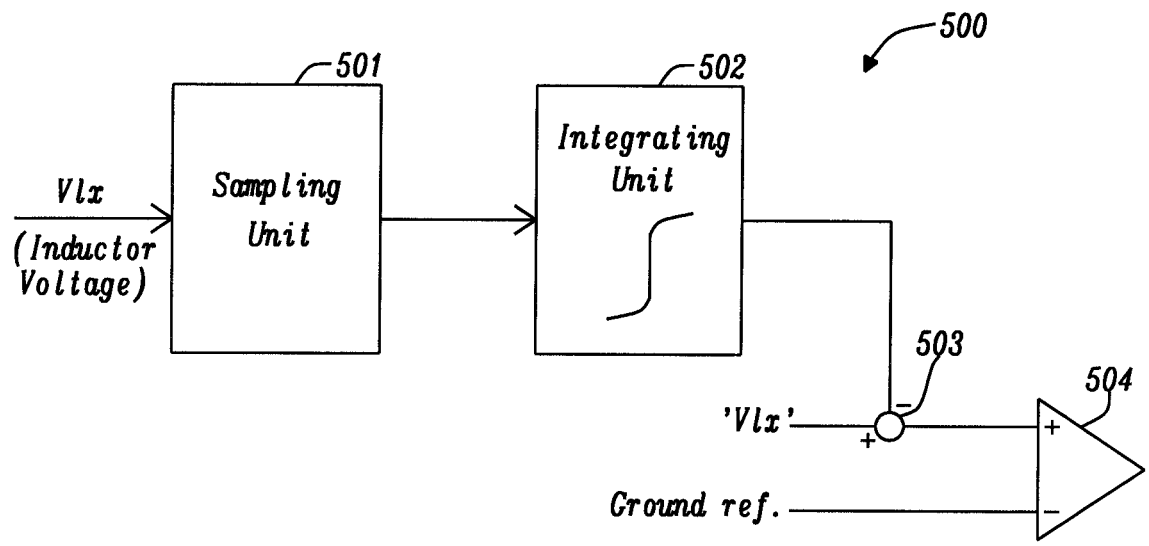
FIG. 5 shows a schematic circuit diagram of an adaptive zero crossing comparison circuit.

FIG. 5 shows an exemplary adaptive zero crossing comparison circuit 500 comprising a sampling unit 501, an integrating unit 502, an offset adjusting unit (subtracting unit) 503 and a zero cross comparator 504. The sampling unit 501 samples the inductor voltage Vlx at the input terminal of the inductor at a time when the low side switching element of the switched mode power converter (not displayed in FIG. 5) is turning off. The sampling unit 501 passes the sampled inductor voltage to the integrating unit 502, which in turn determines an offset voltage by integrating the sampled inductor voltage. An offset adjusting unit 503 determines a first input voltage of the zero cross comparator 504 by subtracting the offset voltage from the present inductor voltage Vlx. Alternatively, depending on the polarity of the offset voltage, the offset adjusting unit 503 may be configured to add the offset voltage and the present inductor voltage Vlx to obtain the first input voltage of the zero cross comparator 504.

As can be seen from FIG. 5, the second input of the zero cross comparator 504 is connected to ground. For example, zero cross comparator 504 may generate a rising edge, a falling edge, or alternatively, a peak signal (as illustrated in FIG. 2) whenever the first input voltage crosses the ground reference. In other words, the example circuit depicted in FIG. 5 compares a modified inductor voltage Vlx against a ground voltage of 0V. However, those skilled in the art will understand that, in a practical implementation of the adaptive zero crossing comparison circuit 500, a DC offset voltage may be required instead of ground reference at the second input of zero cross comparator 504.

Figure 6:
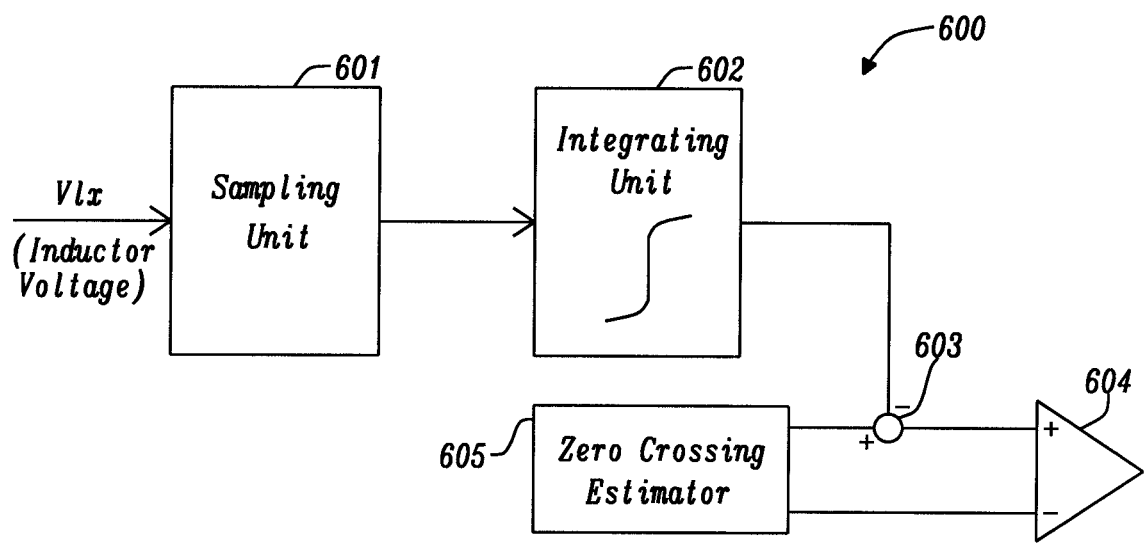
FIG. 6 shows another schematic circuit diagram of an adaptive zero crossing comparison circuit for tuning a zero crossing time estimator (off time estimator)
Figure 7:
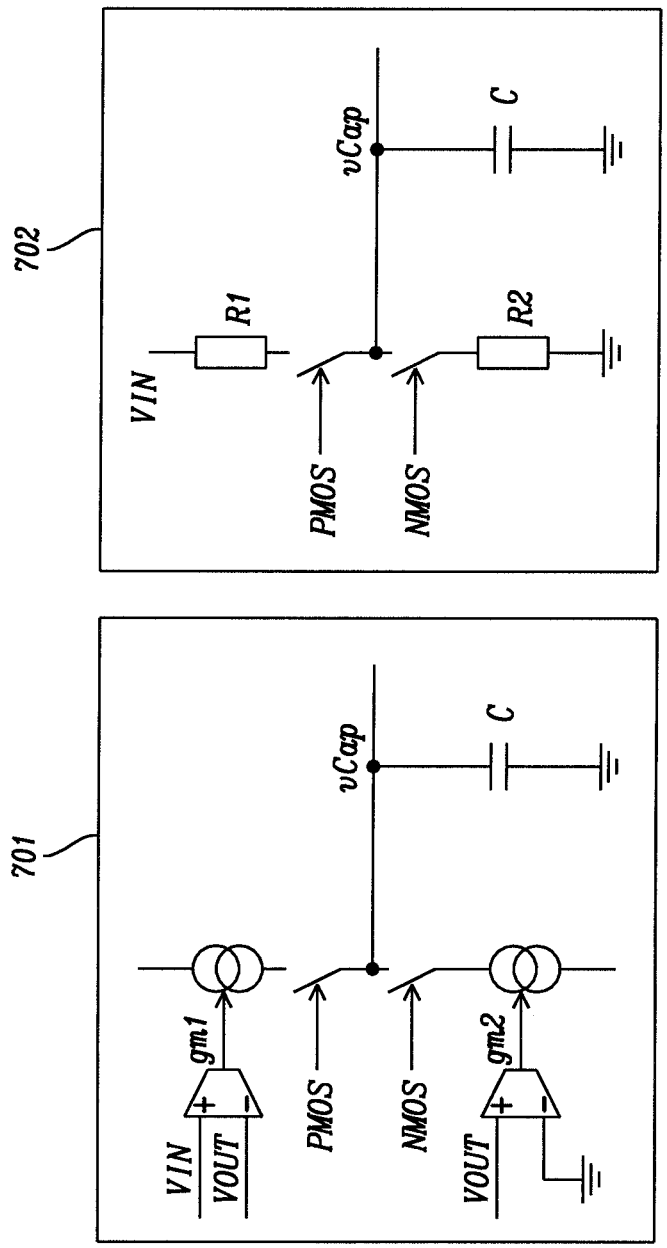
FIG. 7 shows two exemplary zero crossing time estimators.
Figure 8:
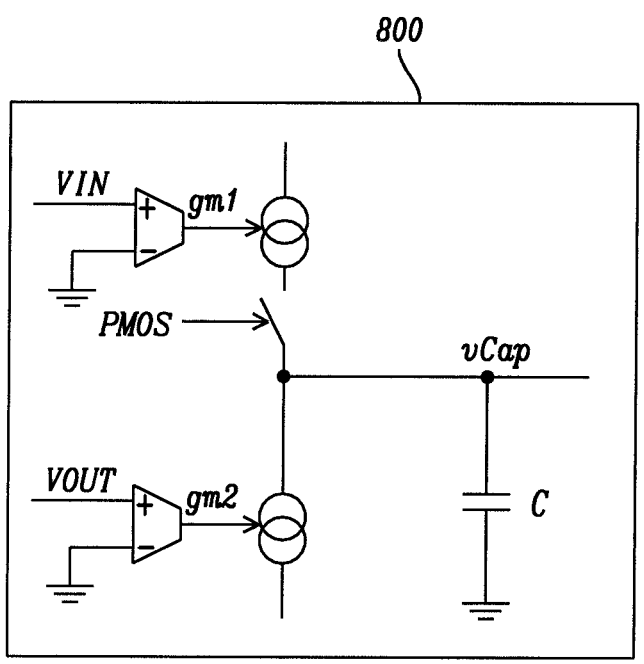
FIG. 8 shows another exemplary zero crossing time estimator.

FIG. 6 illustrates how the adaptive zero crossing comparison circuit 500 presented in FIG. 5 may be applied to a zero crossing time estimator (time off estimator) 605 as presented in US 2014/0340065 A1. In FIG. 6, the depicted adaptive zero crossing comparison circuit 600 comprises a sampling unit 601, an integrating unit 602, an offset adjusting unit 603 (subtracting unit) and a zero cross comparator 604. In FIGS. 7 and 8, three embodiments 701, 702 and 800 of the time off estimator 605 are displayed, wherein the embodiments 701, 702 and 800 correspond to the embodiments in FIGS. 3, 4 and 5 of US 2014/0340065 A1, respectively. In time off estimators 701, 702 and 800, capacitor C is used to mimic the inductor L of the SMPS 100. The voltage vCap may be coupled to an input of offset adjusting unit 603. Offset adjusting unit 603 subtracts an offset voltage from voltage vCap and feeds the results to zero cross comparator 604. Again, the second input terminal of zero cross comparator 604 may e.g. be connected to ground.

In embodiment 701 of a time off estimator in FIG. 7, a time off estimator is formed by a first voltage dependent current source to charge capacitor C during an "on" time of a PMOS transistor and a second voltage dependent current source to discharge capacitor C during an "on" time of an NMOS transistor. In embodiment 702 of a time off estimator in FIG. 7, said first voltage dependent current source is replaced by a first resistor R1 connected to an input voltage VIN and a second resistor R2 replaces said second voltage dependent current source connected to circuit ground. In embodiment 800 of a time off estimator in FIG. 8, said NMOS transistor is eliminated, the first voltage dependent current source is controlled by an input voltage to ground and the second voltage dependent current source is controlled by an output voltage to ground. For a detailed presentation of the off time estimators 701, 702 and 800, the reader is referred to US 2014/0340065 A1. For the sake of completeness, the disclosure of document US 2014/0340065 A1 is herein incorporated by reference in its entirety.

Figure 9:
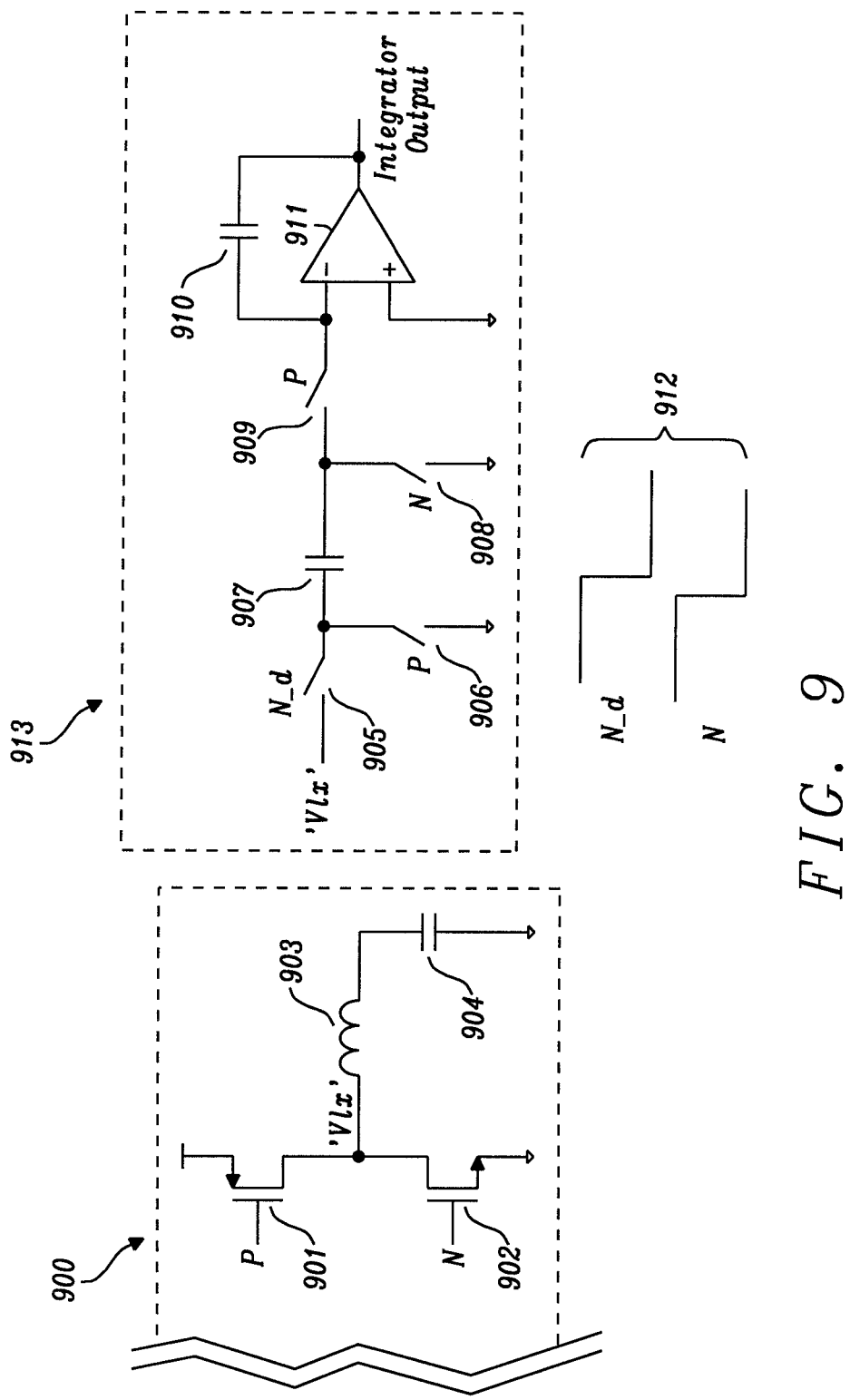
FIG. 9 shows an exemplary switched-mode power converter.

FIG. 9 shows an exemplary switched-mode power converter 900 comprising a high side switching element 901, a low side switching element 902, an inductor 903, and an output capacitor 904. Voltage Vlx at one end of inductor 903 is sampled and integrated by control circuit 913. In other words, control circuit 913 implements both the above-described sampling and integrating unit. At the output of control circuit 913, an offset voltage is provided which may be used, in a subsequent step, to adjust the offset of a zero cross comparator (not shown) which is connected across (i.e. arranged in parallel to) the low side switching element 902.

Control circuit 913 comprises a sampling capacitor 907 to temporarily store a charge corresponding to a temporary inductor voltage Vlx. To be more precise, sampling capacitor 907 stores a charge corresponding to the inductor voltage Vlx at the moment when the low side switching element 902 is turning off because the zero cross comparator has detected a zero crossing of the current through low side switching element 902. Moreover, control circuit 913 comprises an input switching unit 905 which establishes, based on an input control signal N_d, an electrical connection between the input terminal of the sampling capacitor 907 and Vlx, or to isolate said input terminal from Vlx. An output switching unit 908 establishes, based on an output control signal N, an electrical connection between an output terminal of the sampling capacitor 907 and ground, or to isolate said output terminal from ground.

In the example circuit displayed in FIG. 9, the output control signal N corresponds to the control signal for triggering the low side switching element 902 and the input control signal N_d is a time delayed version of the control signal for triggering the low side switching element 902. This circumstance is illustrated by signal waveforms 912 in FIG. 9, wherein a falling edge of output control signal N precedes a falling edge of input control signal N_d.

As illustrated in FIG. 9, control unit 913 further comprises a ground switching unit 906 for establishing, based on a control signal P for triggering the high side switching element 901, an electrical connection between an input terminal of the sampling capacitor 907 and ground, or to isolate said input terminal from ground.

Furthermore, control circuit 913 comprises an operational amplifier 911 and an integrating capacitor 910 coupled in between an inverting input terminal of the operational amplifier 911 and an output of control circuit 913. Integrating capacitor 910 stores a charge indicative of the offset voltage, i.e. a charge indicative of the sampled and integrated inductor voltage Vlx. A further input switching unit 909 establishes, based on control signal P for triggering the high side switching element 901, an electrical connection between the inverting input terminal of the operational amplifier 911 and an output terminal of the sampling capacitor 907, or to isolate said inverting input terminal from said output terminal.

The non-inverting input terminal of the operational amplifier 911 is connected with ground.

Figure 10:
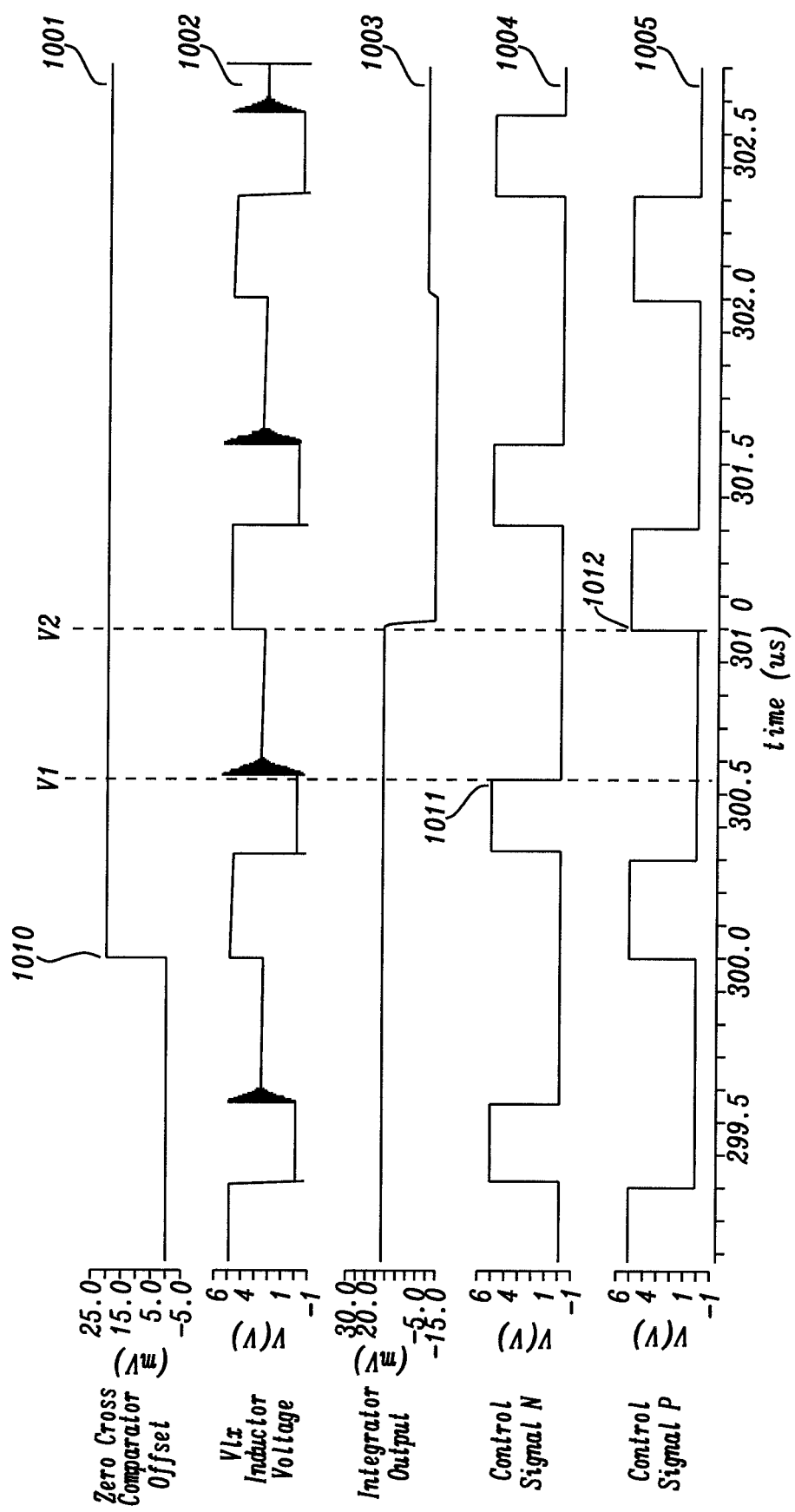
FIG. 10 shows experimental results.

FIG. 10 shows signal waveforms within buck converter 900 and control circuit 913. Specifically, FIG. 10 shows voltage 1001 which is artificially applied to the zero cross comparator to simulate non-ideal behavior (i.e. an offset) of the zero cross comparator, inductor voltage Vlx 1002, the offset voltage 1003 generated at the output of control circuit 913 (i.e. the offset voltage 1003 at the output of integrating unit 502 or 602), control signal N 1004 for controlling the low side switching element 902 and control signal P 1005 for controlling the high side switching element 901.

At time 1010, voltage 1001 is artificially increased from 0 to 20 mV to test the auto-calibration function of control circuit 913. At time 1011, following the falling edge of control signal N 1004, the control circuit 913 samples the inductor voltage Vlx 1002. The sampled inductor voltage Vlx 1002 is integrated e.g. when the rising edge of control signal P 1005 arrives at time 1012. As a result, the offset voltage 1003 decreases to counter the effect of increased voltage 1001 applied to the zero cross comparator. In other words, offset voltage 1003 may be regarded as an estimate of voltage 1001 used to disturb/offset the zero cross comparator. As a result, FIG. 10 shows the settling behavior of the auto-calibration function. The offset voltage 1003 which controls the offset of the zero cross comparator quickly settles to a new value after going through a short transition. Thus, fast convergence of the auto-calibration within a few clock cycles could be demonstrated.

Figure 11:
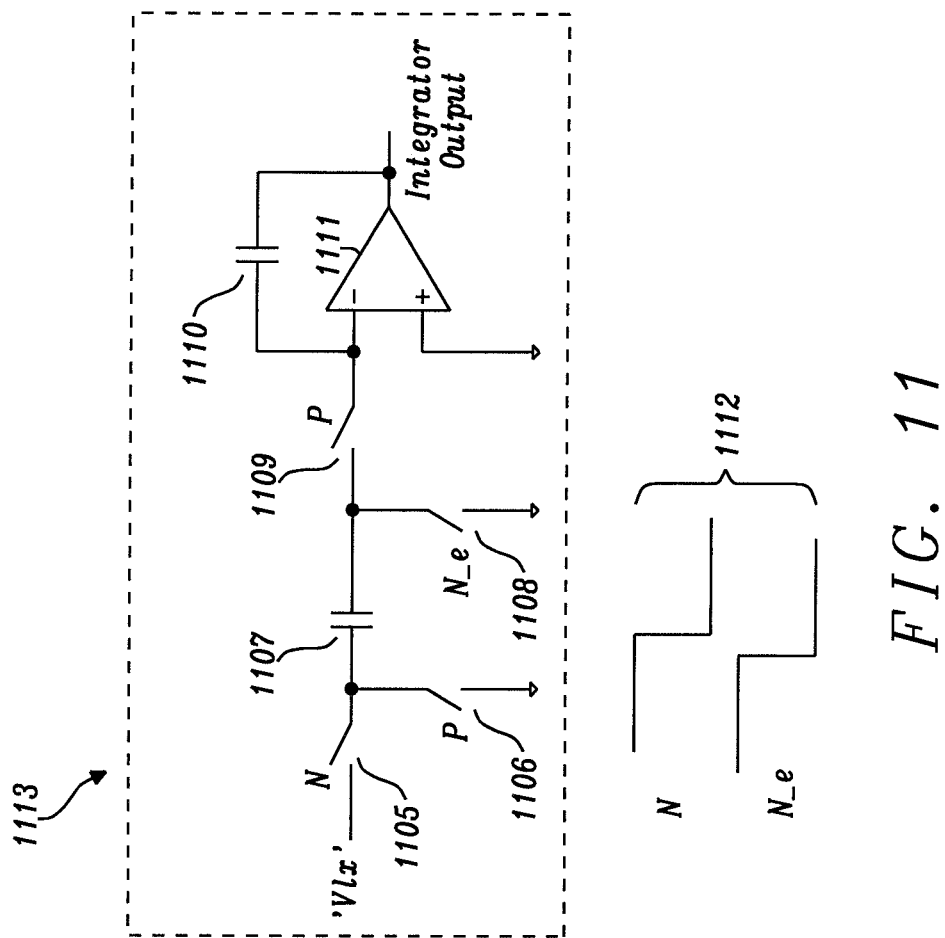
FIG. 11 shows an alternative control circuit for a switched-mode power converter.

FIG. 11 shows an alternative implementation of control circuit 1113 which may be used instead of control circuit 913. The physical structure of the displayed circuit elements is the same as in FIG. 9. However, the input control signal N_d and output control signal N for controlling the input switching unit and the output switching unit, respectively, are replaced by input control signal N and output control signal N_e, wherein N_e denotes a time advanced version of the control signal N for controlling the low side switching element 902. Signal waveforms 1112 illustrate how a falling edge of output control signal N_e precedes a falling edge of input control signal N.

Figure 12:
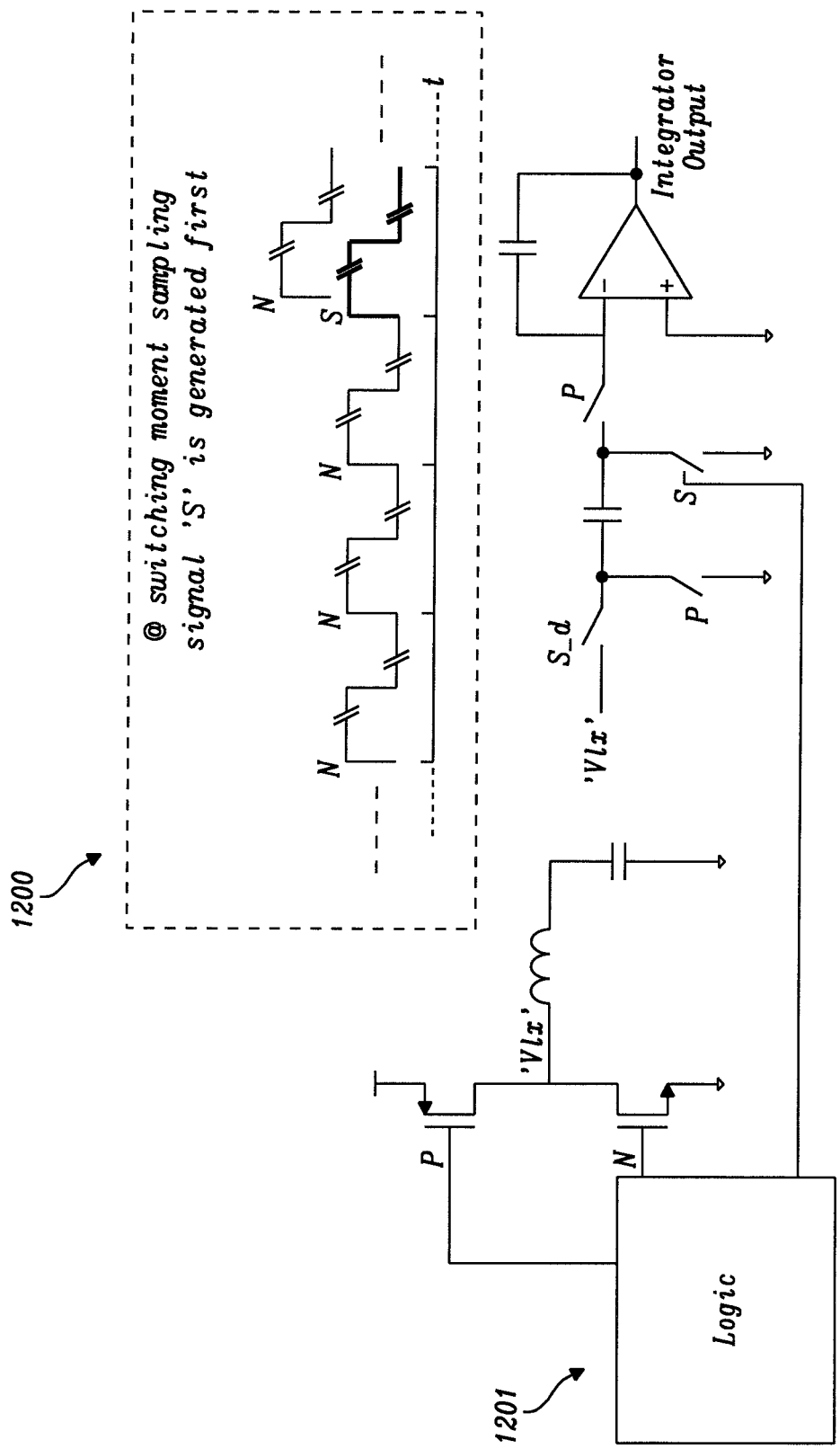
FIG. 12 shows alternative control circuits and an example buck converter.

FIG. 12 shows an exemplary circuit 1200 for sampling the inductor voltage Vlx once every M clock cycles. In other words, the sampling speed and hence the bandwidth requirements of the integrating unit 502, 602 can be reduced by a factor M. In addition to the circuit components discussed in the forgoing, circuit 1200 comprises control logic 1201 for generating a control signal S for controlling the output switching unit of a control circuit (corresponding to control circuits 913, 1113). In the exemplary circuit 1200 depicted in FIG. 12, the input switching unit is driven by a time delayed version S_d of control signal S. Alternatively, the input switching unit may be driven by control signal S and the output switching unit may be driven by a time advanced version S_e of control signal S. For example, during the clock cycle when the inductor voltage Vlx needs to be sampled, control signal S gets precedence over the control signal N for controlling the low side switching unit. This makes sure that sampling occurs at the correct moment in time (i.e. not delayed or earlier). With the help of control signal S generated by control block 1201, it becomes possible to reduce the bandwidth requirement compared to control circuits 913 and 1113, and hence, the power consumption of the overall switched-mode power converter is reduced because sampling speed is reduced.

Figure 13:
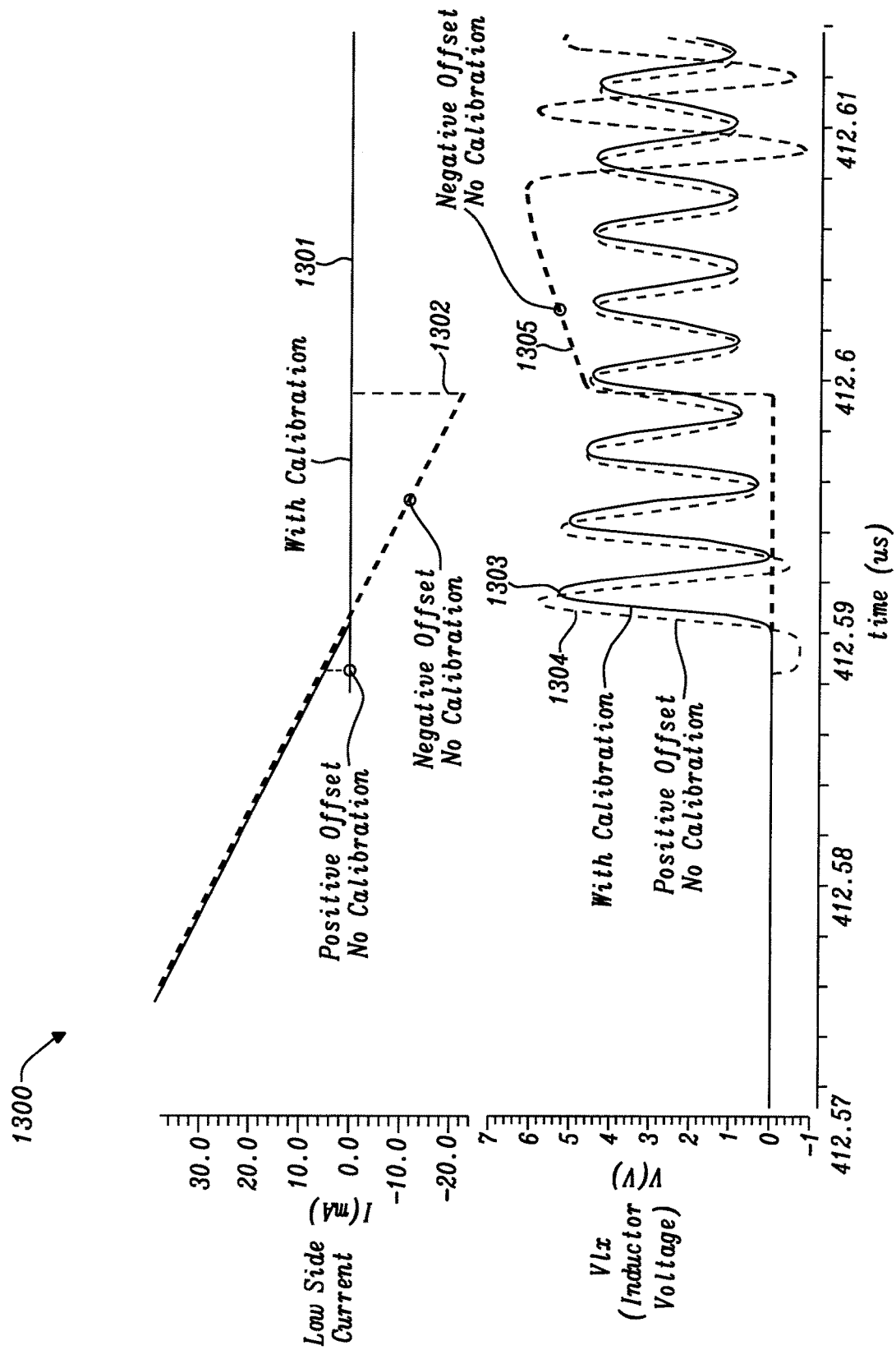
FIGS. 13 and 14 show further experimental results.
Figure 14:
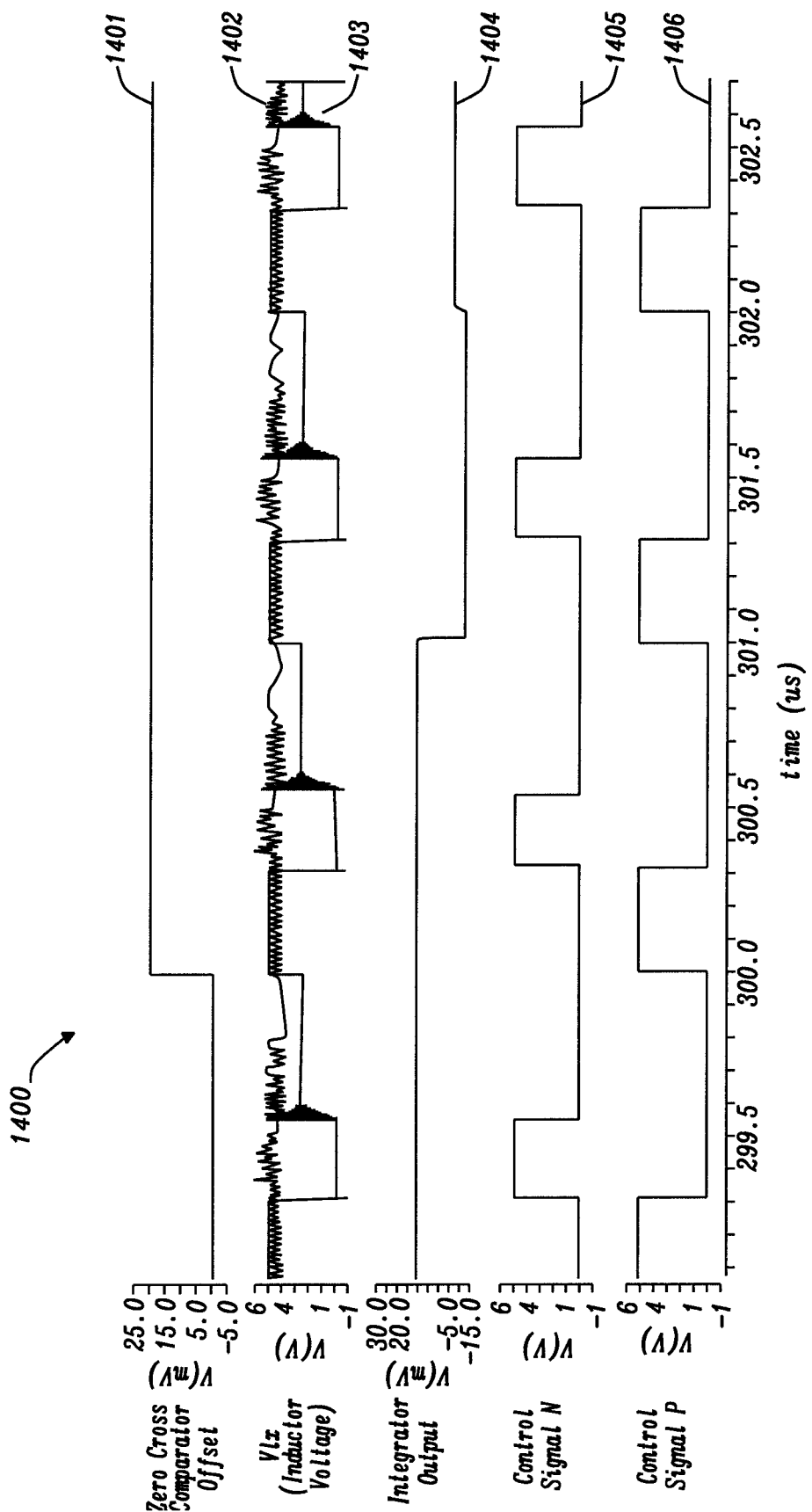

FIGS. 13 and 14 show further experimental results obtained for the circuits described in this document. The top diagram in FIG. 13 shows the current through the low side switching element with and without calibration by the proposed control circuits 913 and 1113. The dashed line 1302 shows how the current through the low side switching element goes negative in case a negative offset (disturbance) is artificially introduced at the zero cross comparator and no calibration takes place. Solid line 1301 illustrates the current through the low side switching element in case calibration is performed by control circuits 913 or 1113 after a negative offset has been applied to the zero cross comparator. It should be mentioned that the solid line 1301 stays the same in case a positive offset is applied to the zero cross comparator. Put in a different way, using the proposed control circuits 913 and 1113, the inductor current drops to zero without any abrupt changes in case a positive or negative offset occurs at the zero cross comparator.

In the bottom half diagram in FIG. 13, solid line 1303 illustrates the inductor voltage Vlx when calibration is active and a negative or positive offset is applied to the zero cross comparator. In contrast, dashed lines 1304 and 1305 show the undesired behavior of the inductor voltage Vlx when no calibration occurs. Dashed line 1304 represents the inductor voltage Vlx in case of a positive offset (disturbance) and dashed line 1305 represents the inductor voltage Vlx in case of a negative offset (disturbance).

FIG. 14 shows the result of an experimental setup in which the supply voltage disturbance is taken into account. The supply voltage 1402 displayed in FIG. 10 represents the voltage at the input of the switched-mode power converter 100, e.g. the voltage between an input terminal of the high side switching element and ground. FIG. 14 shows similar signal waveforms as in FIG. 10. Again, the displayed signal waveforms have been produced by buck converter 900 and control circuit 913 as illustrated in FIG. 9. FIG. 14 shows voltage 1401 which is artificially applied to the zero cross comparator to simulate non-ideal behavior (i.e. an offset) of the zero cross comparator, inductor voltage Vlx 1403, the offset voltage 1404 generated at the output of control circuit 913, control signal N 1405 for controlling the low side switching element 902 and control signal P 1406 for controlling the high side switching element 901. It can be seen that the settling behavior of the calibration is almost identical to the one displayed in FIG. 10. Hence, it has been demonstrated that the proposed system and method is robust against any disturbances of the supply voltage 1402. In contrast, the method proposed in US 2014/0340065 A1 is based on a comparison between the supply voltage and the inductor voltage. Therefore, in US 2014/0340065 A1, a noisy supply voltage may result in errors, which is not the case for the systems and methods proposed in the present patent document.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A switched-mode power converter, comprising
   a high side switching element and a low side switching element,
   an inductor, wherein both the high side switching element and the low side switching element are coupled to an input terminal of the inductor,
   a zero cross comparator configured to generate a trigger signal for opening the low side switching element,
   a sampling unit configured to sample, at a time before the low side switching element is opening, an inductor voltage at the input terminal of the inductor, wherein the sampling unit comprises a sampling capacitor configured to temporarily store an inductor charge corresponding to the inductor voltage,
   an integrating unit configured to determine an offset voltage by integrating the sampled inductor voltage, and
   an offset adjusting unit configured to determine a first input voltage of the zero cross comparator based on the determined offset voltage.

2. The switched-mode power converter according to claim 1, wherein the offset adjusting unit is configured to determine the first input voltage of the zero cross comparator by subtracting the determined offset voltage from the inductor voltage.

3. The switched-mode power converter according to claim 1, wherein a second input voltage of the zero cross comparator is a reference voltage.

4. The switched-mode power converter according to claim 1, wherein the sampling unit comprises a ground switching unit configured to establish, based on a control signal for triggering the high side switching element, an electrical connection between an input terminal of the sampling capacitor and the reference voltage, or to isolate said input terminal from the reference voltage.

5. The switched-mode power converter according to claim 4, wherein the sampling unit comprises an input switching unit configured to establish, based on an input control signal, an electrical connection between the input terminal of the sampling capacitor and the input terminal of the inductor, or to isolate the latter input terminals from each other.

6. The switched-mode power converter according to claim 1, wherein the sampling unit comprises an output switching unit configured to establish, based on an output control signal, an electrical connection between an output terminal of the sampling capacitor and the reference voltage, or to isolate said output terminal from the reference voltage.

7. The switched-mode power converter according to claim 5, wherein both the input control signal and the output control signal are based on a control signal for triggering the low side switching element or the high side switching element.

8. The switched-mode power converter according to claim 7, wherein
   the input control signal corresponds to the control signal for triggering the low side switching element and the output control signal is a time advanced version of the control signal for triggering the low side switching element, or
   the output control signal corresponds to the control signal for triggering the low side switching element and the input control signal is a time delayed version of the control signal for triggering the low side switching element.

9. The switched-mode power converter according to claim 1, wherein the integrating unit comprises
   an operational amplifier, and
   an integrating capacitor coupled in between an inverting input terminal of the operational amplifier and an output of the integrating unit, wherein the integrating capacitor is configured to store a charge indicative of the offset voltage.

10. The switched-mode power converter according to claim 9, wherein the integrating unit comprises an input switching unit configured to establish, based on a control signal for triggering the high side switching element, an electrical connection between the inverting input terminal of the operational amplifier and an output terminal of the sampling capacitor, or to isolate said inverting input terminal from said output terminal.

11. The switched-mode power converter according to claim 10, wherein a non-inverting input terminal of the operational amplifier is connected with the reference voltage.

12. The switched-mode power converter according to claim 1, wherein the low side switching element is arranged between the input terminal of the inductor and the reference voltage.

13. An adaptive zero crossing comparison circuit comprising
   a zero cross comparator configured to generate a trigger signal for opening a low side switching element of a switched-mode power converter,
   a sampling unit configured to sample, at a time before the low side switching element of the switched-mode power converter is opening, an inductor voltage at an input terminal of an inductor of a switched-mode power converter, wherein the sampling unit comprises a sampling capacitor configured to temporarily store an inductor charge corresponding to the inductor voltage,
   an integrating unit configured to determine an offset voltage by integrating the sampled inductor voltage, and an offset adjusting unit configured to determine an input voltage of the zero cross comparator based on the determined offset voltage.

14. The adaptive zero crossing comparison circuit according to claim 13, wherein the offset adjusting unit is configured to determine the input voltage of the zero cross comparator by subtracting the determined offset voltage from the inductor voltage.

15. A method for operating a switched-mode power converter comprising a high side switching element, a low side switching element, and an inductor, wherein both the high side switching element and the low side switching element are coupled to an input terminal of the inductor, the method comprising the steps of:
  generating, by a zero cross comparator, a trigger signal for opening the low side switching element,
  sampling, at a time before the low side switching element is opening, an inductor voltage at the input terminal of the inductor, wherein a sampling unit comprises a sampling capacitor configured to temporarily store an inductor charge corresponding to the inductor voltage,
  determining an offset voltage by integrating the sampled inductor voltage, and
  adjusting an input voltage of the zero cross comparator based on the determined offset voltage.

16. The method according to claim 15, wherein the adjusting comprises the step of:
  determining the input voltage of the zero cross comparator by subtracting the determined offset voltage from the inductor voltage.

* * * * *